US012736567B2

(12) United States Patent
Taniguchi et al.

(10) Patent No.: US 12,736,567 B2
(45) **Date of Patent: *Sep. 15, 2026**

(54) PROPAGATION ENVIRONMENT ESTIMATION METHOD PROPAGATION ENVIRONMENT ESTIMATION SYSTEM AND PROPAGATION ENVIRONMENT ESTIMATION DEVICE

(71) Applicant: NTT, Inc., Tokyo (JP)

(72) Inventors: Ryotaro Taniguchi, Musashino (JP); Yasushi Takatori, Musashino (JP); Tomoki Murakami, Musashino (JP); Tomoaki Ogawa, Musashino (JP); Minoru Inomata, Musashino (JP)

(73) Assignee: NTT, Inc., Tokyo (JP)

( * ) Notice: Subject to any disclaimer, the term of this patent is extended or adjusted under 35 U.S.C. 154(b) by 99 days.

This patent is subject to a terminal disclaimer.

(21) Appl. No.: 18/722,588

(22) PCT Filed: Dec. 24, 2021

(86) PCT No.: PCT/JP2021/048376

§ 371 (c)(1),
(2) Date: Jun. 21, 2024

(87) PCT Pub. No.: WO2023/119661

PCT Pub. Date: Jun. 29, 2023

(65) Prior Publication Data

US 2025/0052795 A1 Feb. 13, 2025

(51) Int. Cl.
*G01R 29/08* (2006.01)
*B33Y 40/20* (2020.01)
(Continued)

(52) U.S. Cl.
CPC ............ *G01R 29/0814* (2013.01); *G01J 1/44* (2013.01); *B33Y 40/20* (2020.01); *B33Y 80/00* (2014.12);
(Continued)

(58) Field of Classification Search
CPC .. G01R 29/0814; G01J 1/44; G01J 2001/444; B33Y 40/20; B33Y 80/00; G01S 7/41; H04B 17/391; H04W 16/18
See application file for complete search history.

(56) References Cited

U.S. PATENT DOCUMENTS

2020/0158855 A1* 5/2020 Blanche .............. G01S 13/9011
2024/0413918 A1 12/2024 Murakami et al.

FOREIGN PATENT DOCUMENTS

JP 2021-069020 A 4/2021
UA 76745 U 1/2013

OTHER PUBLICATIONS

Ichitsubo, Shinichi et al. "Propagation Model and Scale Model Experiment of Light Domain for Clutter Loss in Urban Areas." 2020 International Symposium on Antennas and Propagation (ISAP). IEICE, 2021. 141-142 (Year: 2020).*

(Continued)

*Primary Examiner* — Monica T Taba
(74) *Attorney, Agent, or Firm* — XSENSUS LLP

(57) ABSTRACT

The present disclosure relates to a propagation environment estimation method suitable for environment estimation of a wireless signal using a scale model. The scale model is created. In the scale model, a light source regarded as a transmission station of a radio wave is installed. In the scale model, a light receiving element regarded as a receiver of the radio wave is installed. The light source irradiates a measurement range set in the scale model, and the light receiving element measures a light reception level. Data of the light
(Continued)

reception level acquired in the previous step is converted into a reception level of the radio wave.

20 Claims, 6 Drawing Sheets

(51) Int. Cl.
*B33Y 80/00* (2015.01)
*G01J 1/44* (2006.01)
*G01S 7/41* (2006.01)
*H04B 17/391* (2015.01)

(52) U.S. Cl.
CPC ........... *G01J 2001/444* (2013.01); *G01S 7/41* (2013.01); *H04B 17/391* (2015.01)

(56) References Cited

OTHER PUBLICATIONS

Shinichi Ichitsubo, “Establishment of scale model method for radio wave propagation”, Form C-19, Scientific Research Grant Program (Scientific Research Grant), Research Result Report, May 18, 2012, 10 pages including English Translation.

Office Action issued on Mar. 11, 2026, in related U.S. Appl. No. 18/723,488, 61 pages.

* cited by examiner

PROPAGATION ENVIRONMENT ESTIMATION METHOD PROPAGATION ENVIRONMENT ESTIMATION SYSTEM AND PROPAGATION ENVIRONMENT ESTIMATION DEVICE

CROSS-REFERENCE TO RELATED APPLICATION

The present application is based on PCT filing PCT/JP2021/048376, filed on Dec. 24, 2021, the entire contents of which are incorporated herein by reference.

TECHNICAL FIELD

The present disclosure relates to a propagation environment estimation method, a propagation environment estimation system, and a propagation environment estimation device, and more particularly, to a propagation environment estimation method, a propagation environment estimation device, and a propagation environment estimation system suitable for environment estimation of a wireless signal using a scale model.

BACKGROUND ART

In recent years, with an explosive spread of wireless communication devices, demand for wireless communication has increased. Meanwhile, frequency resources that can be used for wireless communication are limited. Therefore, it is necessary to use a frequency that has not been used so far in addition to existing frequencies. In using a new frequency band, it is necessary to investigate in advance a propagation characteristic of a wireless signal in a service area, an influence of interference of a signal of the new frequency band on another system, and the like.

Under such demands, for example, in the radio communication sector (ITU-R) of International Telecommunication Union (ITU), attempts have been made to actually measure propagation characteristics of radio signals in a real area and formulate a propagation model from various measurement results. However, in this type of attempt, there are problems that a measurement result for an undeveloped frequency is not sufficient, a propagation model is not sufficiently formulated, and the like.

Non Patent Literature 1 below discloses a method for reproducing characteristics of a propagation loss in a mobile communication environment using a scale model. FIG. 1 is a schematic diagram illustrating a state in which a propagation model is estimated by actual measurement in a real area and a state in which model estimation by actual measurement is performed using a scale model in comparison.

As illustrated in FIG. 1, in the method using the scale model, for example, the scale model is produced for a real city area or the like at a scale of 1/100 or the like. Then, a radio signal is generated under the environment of the scale model, and propagation characteristics of radio waves of the wireless signal is measured. According to such a method, cost required for collecting necessary data can be substantially reduced as compared with a case where the propagation environment is actually measured in a real city area.

CITATION LIST

Non Patent Literature

Non Patent Literature 1: "Establishment of scale model method for radio wave propagation", Shinichi ICHITSUBO, Scientific Research Grant Program (Scientific Research Grant), Research Result Report, May 18, 2012

SUMMARY OF INVENTION

Technical Problem

As described above, in the conventional method using the scale model, the propagation environment is estimated by actually measuring behavior of radio waves under the environment of the scale model. At this time, the actual measurement is performed at a frequency changed in accordance with the scale of the scale model, but in a case of using a new frequency band, it is necessary to acquire an appropriate radio wave license each time. Further, since the radio waves are invisible, a propagation state cannot be visually confirmed.

The present disclosure has been made in view of the above problems, and a first object of the present disclosure is to provide a propagation environment estimation method that enables measurement without a radio wave license and visual confirmation of a propagation state, unlike a conventional propagation characteristic estimation method using a scale model.

Further, a second object of the present disclosure is to provide a propagation environment estimation system that enables measurement without a radio wave license and visual confirmation of a propagation state, unlike a conventional propagation characteristic estimation method using a scale model.

Moreover, a third object of the present disclosure is to provide a propagation environment estimation device that enables measurement without a radio wave license and visual confirmation of a propagation state, unlike a conventional propagation characteristic estimation method using a scale model.

Solution to Problem

To achieve the above-described object, the first aspect is a propagation environment estimation method for estimating a propagation environment of a radio wave using a scale model, and desirably includes:

- a step of creating a scale model;
- a step of installing, in the scale model, a light source regarded as a transmission station of a radio wave and a light receiving element regarded as a receiver;
- a step of irradiating a measurement range in the scale model by the light source;
- a step of measuring, by the light receiving element, a light reception level of the measurement range irradiated by the light source; and
- a calibration step of converting data of the light reception level obtained by the measurement into a reception level of the radio wave.

Further, the second aspect is a propagation environment estimation system that estimates a propagation environment of a radio wave using a scale model, and desirably includes:

- a 3D printer that creates a scale model;
- an element mounter that installs, in the scale model, a light source regarded as a transmission station of a radio wave and a light receiving element regarded as a receiver; and
- a control device that causes the light source to irradiate a measurement range in the scale model and causes the light receiving element to measure a light reception level, in which the control device is desirably configured to execute calibration processing of converting data of the light reception level obtained by the measurement into a reception level of the radio wave.

Further, the third aspect is a propagation environment estimation device that estimates a propagation environment of a radio wave using a scale model, and desirably includes:

a 3D printer unit that creates a scale model;

an element mounter unit that installs, in the scale model, a light source regarded as a transmission station of a radio wave and a light receiving element regarded as a receiver; and a control device unit that causes the light source to irradiate a measurement range in the scale model and causes the light receiving element to measure a light reception level, in which the control device unit is configured to execute calibration processing of converting data of the light reception level obtained by the measurement into a reception level of the radio wave.

Advantageous Effects of Invention

According to the first to third aspects, it is possible to perform measurement without a radio wave license and visually confirm a propagation state, unlike a conventional propagation characteristic estimation method using a scale model.

DESCRIPTION OF EMBODIMENTS

First Embodiment

Outline of First Embodiment

Figure 1:
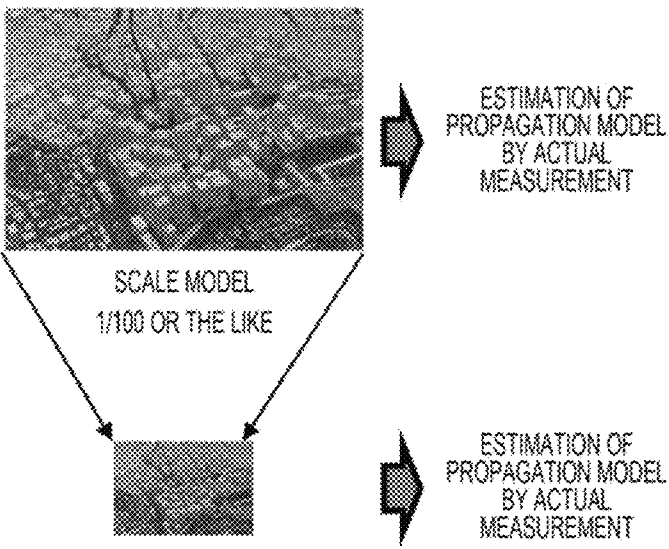
FIG. 1 is a schematic diagram illustrating a state in which a propagation model is estimated by actual measurement in a real area and a state in which model estimation by actual measurement is performed using a scale model in comparison.
Figure 2:
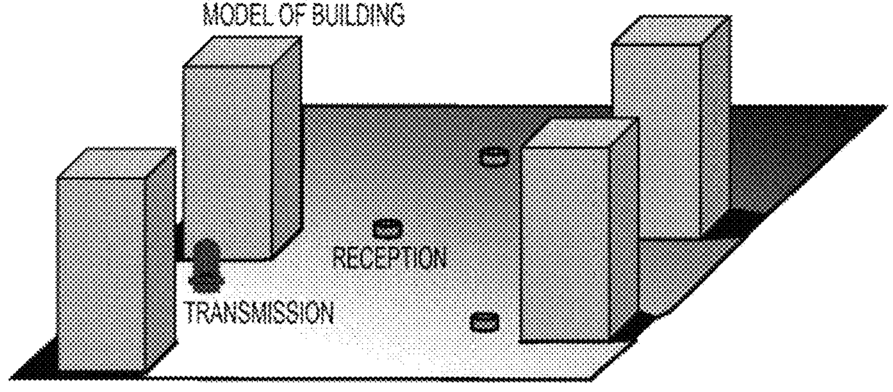
FIG. 2 is a perspective view of a scale model used in a propagation environment estimation method according to a first embodiment of the present disclosure.
Figure 3:
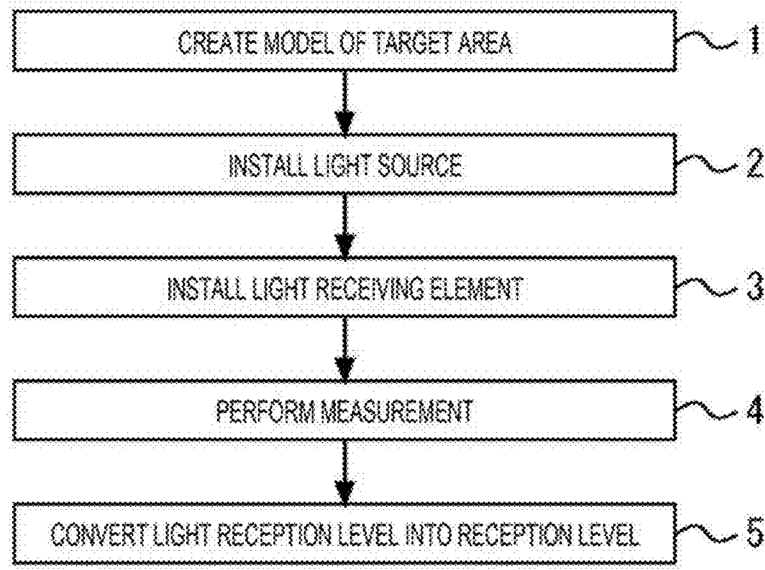
FIG. 3 is a flowchart of an estimation procedure according to the first embodiment of the present disclosure.

FIG. 2 is a perspective view of a scale model used in a propagation environment estimation method according to a first embodiment of the present disclosure, and FIG. 3 is a flowchart of an estimation procedure according to the first embodiment of the present disclosure. As illustrated in FIG. 3, in the propagation environment estimation method of the present embodiment, estimation of a propagation environment is advanced by the following procedure.

1. A model of the target area is created. Hereinafter, this model is referred to as a "scale model". The scale model reproduces a real urban space or the like at a scale of about 1/100, for example. FIG. 2 illustrates an example in which an outdoor space is set as the target area, but an indoor space of a specific building may be set as the target area.
2. A light source is installed as a transmission source of radio waves. As the light source, for example, a light emitting diode, an incandescent lamp, or the like can be used.
3. A light receiving element regarded as a receiver of radio waves is installed. As the light receiving element, for example, a photoresistor, a photodiode, or a phototransistor can be used.
4. The light source is caused to emit light, and the light receiving element measures a light reception level. In a region imitating a ground of the scale model in FIG. 2, a white portion is an irradiation range, and a black portion is a non-irradiation range. Further, a higher brightness indicates a higher light reception level.
5. Data of the light reception level acquired in the previous step is calibrated according to an actual communication environment and a distance characteristic of a simulation result, and the light reception level is converted into a reception level of the radio waves.

Points to be Noted in First Embodiment (1) In creating the scale model of the target area, it is necessary to appropriately determine what scale is adopted. In the present embodiment, representatively, the following points are noted in determining the scale.

(1-a) Installation Space for Element or the Like

As described above, in the present embodiment, it is necessary to install the light emitting element regarded as a transmission source of radio waves and the light receiving element regarded as a receiver of radio waves at their places in the scale model.

These elements are installed on a road or in a square in the target area. Then, the installation space changes according to the scale of the scale model, and if an excessive scale is adopted, a situation where these elements cannot be installed at the corresponding place of the scale model. Therefore, in the present embodiment, the scale of the scale model is determined so that various elements required for estimating the propagation characteristic do not interfere with a building or the like.

(1-b) Reaching Distance of Measurement Light

Figure 4:
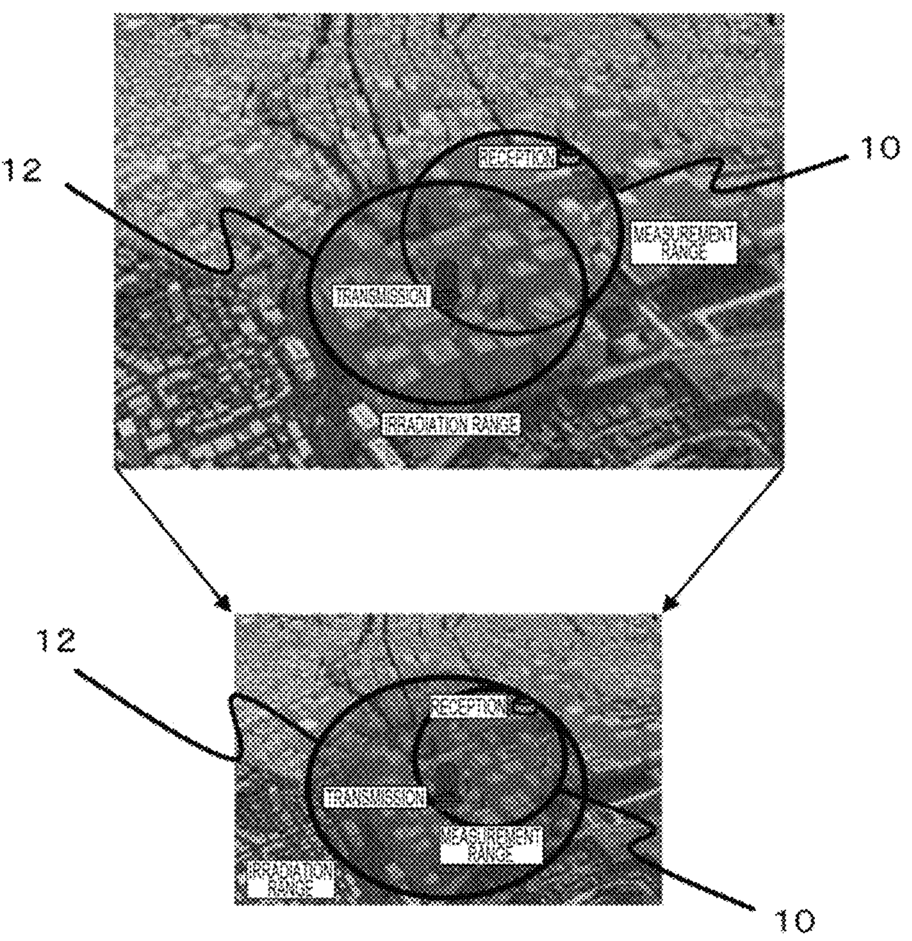
FIG. 4 is a diagram for describing one of points to be noted in determining a scale of the scale model in the propagation environment estimation method according to the first embodiment of the present disclosure.

FIG. 4 illustrates two types of scale models with different scales in comparison. More specifically, the upper part of FIG. 4 illustrates a scale model with a large scale, and the lower part of FIG. 4 illustrates a scale model with a small scale. In each scale model, an area where the propagation characteristic is desired to be measured is indicated as a "measurement range" 10. Further, an arrival circle of light emitted from the light source regarded as a transmission source of radio waves is illustrated as an "irradiation range" 12.

In the scale model in the upper part of FIG. 4, a region beyond the irradiation range 12 of the light source is generated in a part of the measurement range 10 due to the too large scale. In this case, even if the light receiving element measures light emission intensity by the light source, desired data cannot be obtained for the entire measurement range 10. On the other hand, in the scale model in the lower part of FIG. 4, the entire measurement range 10 is covered with the irradiation range 12. In this case, by measuring the light emission intensity by the light source, desired data can be obtained for the entire measurement range 10. In view of such circumstances, in the present embodiment, the scale of the scale model is determined such that the entire measurement range 10 falls within the irradiation range 12 without excess or deficiency, as illustrated in the lower part of FIG. 4.

(2) It is desirable that behavior of the light regarded as the radio waves is consistent with behavior of the radio waves in a real area. In a propagation characteristic estimation method of the present embodiment, the following points are taken into consideration in order to meet the above requirements.

(2-a) Reflectance of Radio Waves and Light

Reflectance of the radio waves in each part of the target area is reflected in the behavior of the radio waves. Similarly, the behavior of the light emitted from the light source is affected by the reflectance of the light in each part of the scale model. In the present embodiment, surface treatment is applied to each part of the scale model so that the reflectance of the radio waves in each part of the target area is consistent with the reflectance of the light in each part of the scale model. The surface treatment is performed by, for example, applying a coating material, texturing a model wall surface, or the like.

(2-b) Attenuation Rate of Radio Waves and Light

Intensity of the radio waves attenuates according to a distance from the transmission source. The attenuation rate is affected by the frequency of the radio waves. On the other hand, the intensity of light also exhibits attenuation according to a wavelength of light according to the distance from the light source. In the present embodiment, to replace the attenuation of the light in the scale model with the attenuation of the radio waves in the target area, calibration processing is applied to data of the light reception level obtained by the light receiving element in the scale model. The calibration processing is performed by, for example, multiplying a ratio between the attenuation rate of the radio waves in the target area and the attenuation rate of the light actually measured in the scale model by the acquired data of the light reception level.

(2-c) Frequency Characteristics of Radio Waves and Wavelength Characteristics of Light The behavior of the radio waves in the real target area is affected by the frequency. To estimate the actual behavior of the radio waves from the behavior of the light in the scale model, it is desirable that the light used in the scale model exhibits behavior similar to that of the actual radio waves. In the present embodiment, the wavelength of light used for the light source is appropriately selected in order to meet the above requirements. Specifically, in the present embodiment, several light sources each emitting light of red, blue, yellow, or the like are prepared, and the light source is appropriately selected according to the radio wave to be used in the target area.

Details of Procedures in First Embodiment

Figure 5:
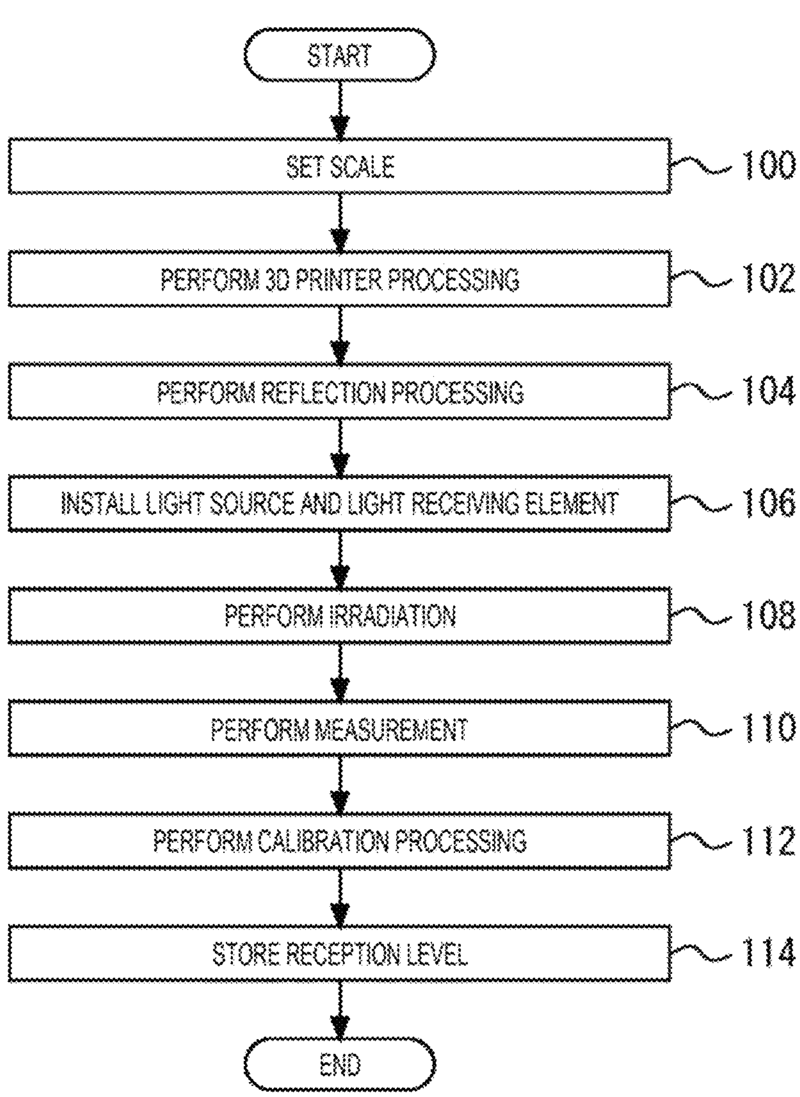
FIG. 5 is a flowchart for describing a flow of processing when estimating a propagation environment according to the propagation environment estimation method of the first embodiment of the present disclosure.

FIG. 5 is a flowchart for describing a procedure of a propagation environment estimation method of the present embodiment in detail. The procedure illustrated in FIG. 5 is started when collection of information such as dimensions and locations of buildings and roads, the reflectance of the radio waves at main points, and the frequency of the radio waves scheduled to be used is completed for the real target area, and specifications of the light source and the like used for measurement are determined.

As illustrated in FIG. 5, according to this procedure, first, the scale of the scale model to be produced is determined (step 100). In present step 100, with attention being paid to the above points (1-a) and (1-b), the scale without excess or deficiency is determined under essential conditions that the elements such as the light source can be installed and that the irradiation range 12 by the light source covers the entire measurement range 10.

Next, the scale model is created by a 3D printer (step 102). Here, first, information regarding dimensions and arrangement of various buildings and the like existing in the target area is provided to the 3D printer together with the above-described scale. The 3D printer creates the scale model of the target area according to the provided scale.

When the processing of the 3D printer is completed, next, reflection processing is applied to the created scale model (step 104). For example, coating treatment, surface treatment, or the like for adjusting the reflectance of light with the reflectance of the radio waves is applied to the model wall surface of the building. The reflection processing in present step may be manually performed by an operator. Alternatively, the coating treatment may be performed by a fully automatic coating device capable of three-dimensionally specifying a coating place. Further, the surface treatment may be implemented by processing using a 3D printer.

Next, the light source regarded as a transmission station of radio waves and the light receiving element regarded as a receiver are installed (step 106). The light source is installed at an installation proposed location of the transmission station in the scale model, and the light receiving element is installed at an installation proposed location of the receiver in the scale model. The light source and the light receiving element may be manually installed by an operator or may be installed by a fully automatic element mounter without manual operation.

When the above preparation is completed, next, irradiation of the scale model by the light source is started (step 108). In a case where the light source is a light emitting diode or an incandescent lamp, lighting processing for the light source is performed in present step 108.

When the irradiation by the light source is started, next, the light reception level of the measurement range 10 is measured (step 110). When the measurement of the measurement range 10 is completed, next, the calibration processing is performed (step 112). Specifically, first, light reception intensity data of the measurement range 10 acquired by the measurement is read. Next, the reception level of the radio waves is calculated for each reception point by calculating the ratio of the attenuation rates described in (2-b) above for each light reception intensity, and multiplying the above numerical value and the above ratio for each reception point.

Finally, a set of values for each reception point calculated in step 112 above is stored as information that planarly indicates the reception level of the radio waves (step 114).

Propagation Environment Estimation System of First Embodiment

Figure 6:
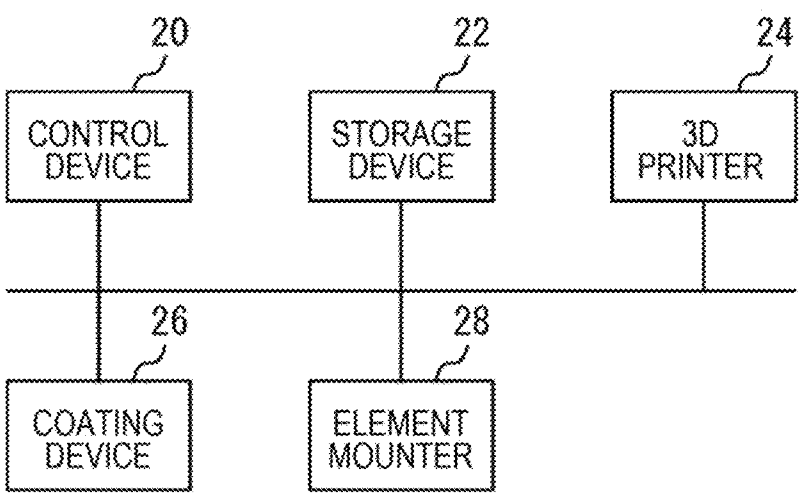
FIG. 6 is a block diagram for describing a configuration of a propagation environment estimation system that continuously performs a series of processing illustrated in FIG. 5 in a fully automatic manner.

FIG. 6 is a block diagram for describing a configuration of a propagation environment estimation system capable of continuously performing the series of processing illustrated in FIG. 5 in a fully automatic manner. The system illustrated in FIG. 6 includes a control device 20 and a storage device 22. The control device 20 includes an arithmetic processing unit. The storage device 22 stores a program to be executed by the arithmetic processing unit. The control device 20 controls each unit of the system illustrated in FIG. 6 by the arithmetic processing unit proceeding with processing according to the above-described program.

The storage device 22 stores various types of information regarding the target area in addition to the above-described program. This information includes the dimensions and locations of buildings, roads, and the like, the reflectance of the radio waves, and the like. The storage device 22 also stores dimensional data of various elements that can be used in the scale model. Furthermore, the storage device 22 also stores the result of measurement performed using the scale model, that is, information of the planar reception level obtained in the processing of step 112.

The system illustrated in FIG. 6 includes a 3D printer 24. The control device 20 reads the various types of information from the storage device 22 and performs the processing of step 100 described above, that is, the scale determination processing. The 3D printer 24 reads the information regarding the target area from the storage device 22, and cuts out the scale model at the scale determined by the control device 20. In a case where texture processing needs to be applied to a specific portion in order to make the reflectance of the radio waves and the reflectance of the measurement light uniform, the processing is also performed by the 3D printer 24.

The system illustrated in FIG. 6 includes a coating device 26. The coating device 26 includes a coating material nozzle that can three-dimensionally move, and can apply a desired coating material to an arbitrary position of the scale model. In response to a command from the control device 20, the coating device 26 can apply coating for obtaining the desired reflectance to a specified position of the scale model on the basis of the information read from the storage device 22.

The system illustrated in FIG. 6 includes an element mounter 28. The element mounter 28 has a function to install an element scheduled to be used in the scale model at an arbitrary position of the scale model. In the present embodiment, an element that functions as the light source and an element that functions as the receiver are installed by the element mounter 28 in accordance with a command from the control device 20.

The element that functions as the receiver installed above receives light emission from the element that functions as the light source. The light reception data is stored in the storage device 22. The control device 20 can planarly estimate the reception level of the radio waves generated in the measurement range 10 by applying the calibration processing in step 112 above to the light reception data stored in the storage device 22. The estimated reception level is stored in the storage device 22 as described above.

As described above, according to the propagation environment estimation method of the present embodiment, it is possible to perform measurement without a radio wave license and visually confirm a propagation state, unlike a conventional propagation characteristic estimation method using a scale model. Further, according to the estimation method of the present embodiment, the cost required for estimating the propagation environment of the target area can also be substantially reduced.

Further, according to the propagation environment estimation system described with reference to FIG. 6, the propagation environment estimation method of the present embodiment can be advanced as a fully automatic procedure in a straight manner. Therefore, according to this system, work efficiency regarding the estimation of the propagation environment of the target area can be significantly improved.

Meanwhile, in the above-described first embodiment, the configuration illustrated in FIG. 6 has been described as a system including a plurality of devices, but the present disclosure is not limited thereto. That is, the configuration illustrated in FIG. 6 may be a single device in which the illustrated elements are housed in a single housing.

REFERENCE SIGNS LIST

10 Measurement range
12 Irradiation range
20 Control device
22 Storage device
24 3D printer
26 Coating device
28 Element mounter

The invention claimed is:

1. A propagation environment estimation method for estimating a propagation environment of a radio wave using a scale model, the propagation environment estimation method comprising:
- creating a scale model;
- installing, in the scale model, a light source regarded as a transmission station of a radio wave and a light receiving element regarded as a receiver;
- irradiating a measurement range in the scale model by the light source;
- measuring, by the light receiving element, a light reception level of the measurement range irradiated by the light source; and
- calibrating, by converting data of the light reception level obtained by the measurement into a reception level of the radio wave,
- wherein the calibrating includes calibrating the data of the light reception level on a basis of an attenuation characteristic of the radio wave corresponding to a propagation distance in a target area.

2. The propagation environment estimation method according to claim 1, further comprising: setting a scale of the scale model prior to the creation of the scale model,
- the setting of said scale including
- acquiring information regarding installation spaces of the transmission station and the receiver in a target area,
- acquiring dimensions of the light source and the light receiving element, and
- setting the scale such that the light source and the light receiving element are accommodated in corresponding portions of the installation space in the scale model.

3. The propagation environment estimation method according to claim 1, further comprising: setting a scale of the scale model prior to the creation of the scale model,
- the setting of said scale including
- acquiring information of a range in which a propagation environment of the radio wave is to be measured in a target area,
- recognizing a portion of the scale model, the portion corresponding to the range, as the measurement range,
- acquiring information of an irradiation range by the light source, and
- setting the scale such that the measurement range falls within the irradiation range.

4. The propagation environment estimation method according to claim 1, further comprising: applying reflection treatment to at least a part of the scale model such that a light reflectance in the scale model matches a radio wave reflectance in a target area.

5. The propagation environment estimation method according to claim 1, further comprising: setting a wavelength of light emitted from the light source on a basis of a frequency of the radio wave assumed to be used in a target area such that a behavior of light in the scale model matches a behavior of the radio wave in the target area.

6. The propagation environment estimation method according to claim 1, wherein the calibrating further includes acquiring an attenuation characteristic of light emitted from the light source in the scale model, and calibrating the data of the light reception level on a basis of the attenuation characteristic of the radio wave and the attenuation characteristic of the light.

7. A propagation environment estimation system that estimates a propagation environment of a radio wave using a scale model, the propagation environment estimation system comprising:

a 3D printer that creates a scale model;

an element mounter that installs, in the scale model, a light source regarded as a transmission station of a radio wave and a light receiving element regarded as a receiver; and a controller that causes the light source to irradiate a measurement range in the scale model and causes the light receiving element to measure a light reception level, wherein the controller is configured to execute calibration treatment of converting data of the light reception level obtained by the measurement into a reception level of the radio wave, the calibration treatment including calibrating the data of the light reception level on a basis of an attenuation characteristic of the radio wave corresponding to a propagation distance in a target area.

8. A propagation environment estimation device that estimates a propagation environment of a radio wave using a scale model, the propagation environment estimation device comprising:

a 3D printer that creates a scale model;

an element mounter that installs, in the scale model, a light source regarded as a transmission station of a radio wave and a light receiving element regarded as a receiver; and a controller that causes the light source to irradiate a measurement range in the scale model and causes the light receiving element to measure a light reception level, wherein the controller is configured to execute calibration treatment of converting data of the light reception level obtained by the measurement into a reception level of the radio wave, the calibration treatment including calibrating the data of the light reception level on a basis of an attenuation characteristic of the radio wave corresponding to a propagation distance in a target area.

9. The propagation environment estimation method according to claim 2, further comprising: applying reflection treatment to at least a part of the scale model such that a light reflectance in the scale model matches a radio wave reflectance in a target area.

10. The propagation environment estimation method according to claim 3, further comprising: applying reflection treatment to at least a part of the scale model such that a light reflectance in the scale model matches a radio wave reflectance in a target area.

11. The propagation environment estimation method according to claim 2, further comprising: setting a wavelength of light emitted from the light source on a basis of a frequency of the radio wave assumed to be used in a target area such that a behavior of light in the scale model matches a behavior of the radio wave in the target area.

12. The propagation environment estimation method according to claim 3, further comprising: setting a wavelength of light emitted from the light source on a basis of a frequency of the radio wave assumed to be used in a target area such that a behavior of light in the scale model matches a behavior of the radio wave in the target area.

13. The propagation environment estimation method according to claim 9, further comprising: setting a wavelength of light emitted from the light source on a basis of a frequency of the radio wave assumed to be used in a target area such that a behavior of light in the scale model matches a behavior of the radio wave in the target area.

14. The propagation environment estimation method according to claim 10, further comprising: setting a wavelength of light emitted from the light source on a basis of a frequency of the radio wave assumed to be used in a target area such that a behavior of light in the scale model matches a behavior of the radio wave in the target area.

15. The propagation environment estimation method according to claim 2, wherein the calibrating further includes acquiring an attenuation characteristic of light emitted from the light source in the scale model, and calibrating the data of the light reception level on a basis of the attenuation characteristic of the radio wave and the attenuation characteristic of the light.

16. The propagation environment estimation method according to claim 3, wherein the calibrating further includes acquiring an attenuation characteristic of light emitted from the light source in the scale model, and calibrating the data of the light reception level on a basis of the attenuation characteristic of the radio wave and the attenuation characteristic of the light.

17. The propagation environment estimation method according to claim 9, wherein the calibrating further includes acquiring an attenuation characteristic of light emitted from the light source in the scale model, and calibrating the data of the light reception level on a basis of the attenuation characteristic of the radio wave and the attenuation characteristic of the light.

18. The propagation environment estimation method according to claim 11, wherein the calibrating further includes acquiring an attenuation characteristic of light emitted from the light source in the scale model, and calibrating the data of the light reception level on a basis of the attenuation characteristic of the radio wave and the attenuation characteristic of the light.

19. The propagation environment estimation method according to claim 13, wherein the calibrating further includes acquiring an attenuation characteristic of light emitted from the light source in the scale model, and calibrating the data of the light reception level on a basis of the attenuation characteristic of the radio wave and the attenuation characteristic of the light.

20. The propagation environment estimation method according to claim 14, wherein the calibrating further includes acquiring an attenuation characteristic of light emitted from the light source in the scale model, and calibrating the data of the light reception level on a basis of the attenuation characteristic of the radio wave and the attenuation characteristic of the light.

* * * * *